United States Patent
Jain et al.

(10) Patent No.: US 9,703,203 B2
(45) Date of Patent: Jul. 11, 2017

(54) COMPOSITIONS AND METHODS FOR PATTERN TREATMENT

(71) Applicants: Dow Global Technologies LLC, Midland, MI (US); Rohm and Haas Electronic Materials LLC, Marlborough, MA (US)

(72) Inventors: Vipul Jain, North Grafton, MA (US); Mingqi Li, Shrewsbury, MA (US); Huaxing Zhou, Furlong, PA (US); Jong Keun Park, Shrewsbury, MA (US); Phillip D. Hustad, Natick, MA (US); Jin Wuk Sung, Northborough, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/172,260

(22) Filed: Jun. 3, 2016

(65) Prior Publication Data

US 2016/0357111 A1    Dec. 8, 2016

Related U.S. Application Data

(60) Provisional application No. 62/170,534, filed on Jun. 3, 2015.

(51) Int. Cl.
*G03F 7/11* (2006.01)
*G03F 7/40* (2006.01)
(Continued)

(52) U.S. Cl.
CPC ............ *G03F 7/405* (2013.01); *C08F 293/00* (2013.01); *C09D 153/00* (2013.01); *G03F 7/002* (2013.01);
(Continued)

(58) Field of Classification Search
CPC .......... G03F 7/002; G03F 7/165; G03F 7/168; G03F 7/20; G03F 7/40; H01L 21/0274; C09D 153/00; C08F 293/00
(Continued)

(56) References Cited

U.S. PATENT DOCUMENTS

| 4,665,131 A | * 5/1987 | Moriya ................. C08F 293/00 525/277 |
| 7,553,610 B2 | 6/2009 | Kaneko et al. |

(Continued)

FOREIGN PATENT DOCUMENTS

| JP | 2007121346 A | 5/2007 |
| WO | 2013065878 A1 | 5/2013 |

(Continued)

OTHER PUBLICATIONS

Cheng, et al, "EUVL compatible, LER solutions using functional block copolymers", Proc. of SPIE, vol. 8323, 2012, pp. 832310-1-832310-11.

(Continued)

*Primary Examiner* — Amanda C Walke
(74) *Attorney, Agent, or Firm* — Jonathan D. Baskin

(57) ABSTRACT

Pattern treatment compositions comprise a block copolymer and an organic solvent. The block copolymer comprises a first block and a second block. The first block comprises a unit formed from a first monomer comprising an ethylenically unsaturated polymerizable group and a hydrogen acceptor group, wherein the hydrogen acceptor group is a nitrogen-containing group. The second block comprises a unit formed from a second monomer comprising an ethylenically unsaturated polymerizable group and a cyclic aliphatic group. Wherein: (i) the second block comprises a unit formed from a third monomer comprising an ethylenically unsaturated polymerizable group, and the second monomer (Continued)

and the third monomer are different; and/or (ii) the block copolymer comprises a third block comprising a unit formed from a fourth monomer comprising an ethylenically unsaturated polymerizable group, wherein the fourth monomer is different from the first monomer and the second monomer. Also provided are pattern treatment methods using the described compositions. The pattern treatment compositions and methods find particular applicability in the manufacture of semiconductor devices for providing high resolution patterns.

11 Claims, 2 Drawing Sheets

(51) Int. Cl.
| | |
|---|---|
| G03F 7/004 | (2006.01) |
| G03F 7/20 | (2006.01) |
| G03F 7/16 | (2006.01) |
| G03F 7/00 | (2006.01) |
| C08F 293/00 | (2006.01) |
| H01L 21/027 | (2006.01) |
| C09D 153/00 | (2006.01) |
| G03F 7/039 | (2006.01) |
| G03F 7/32 | (2006.01) |

(52) U.S. Cl.
CPC .............. *G03F 7/0397* (2013.01); *G03F 7/11* (2013.01); *G03F 7/165* (2013.01); *G03F 7/168* (2013.01); *G03F 7/20* (2013.01); *G03F 7/325* (2013.01); *G03F 7/40* (2013.01); *H01L 21/0274* (2013.01)

(58) Field of Classification Search
USPC ............ 430/270.1, 322, 325, 329, 330, 331; 525/450, 540; 524/251
See application file for complete search history.

(56) References Cited

U.S. PATENT DOCUMENTS

| | | | |
|---|---|---|---|
| 7,745,077 B2 | 6/2010 | Thiyagarajan et al. | |
| 9,437,452 B2* | 9/2016 | Park | H01L 21/31144 |
| 2003/0212213 A1* | 11/2003 | Bendejacq | C08F 293/00 |
| | | | 525/242 |
| 2009/0181171 A1* | 7/2009 | Cheng | B05D 5/02 |
| | | | 427/256 |
| 2010/0239984 A1 | 9/2010 | Tsubaki | |
| 2011/0147983 A1 | 6/2011 | Cheng et al. | |
| 2013/0210231 A1 | 8/2013 | Senzaki et al. | |
| 2013/0231438 A1* | 9/2013 | Kim | B82Y 10/00 |
| | | | 524/500 |
| 2013/0240481 A1 | 9/2013 | Senzaki et al. | |
| 2014/0242359 A1 | 8/2014 | Nakamura et al. | |
| 2014/0370442 A1* | 12/2014 | Ober | C08F 214/18 |
| | | | 430/296 |
| 2015/0086929 A1 | 3/2015 | Hatakeyama et al. | |
| 2015/0093508 A1* | 4/2015 | Nagai | B82Y 40/00 |
| | | | 427/271 |
| 2015/0118852 A1 | 4/2015 | Lee et al. | |
| 2015/0338744 A1 | 11/2015 | Hatakeyama et al. | |
| 2016/0030896 A1* | 2/2016 | Lorain | B01D 71/34 |
| | | | 210/650 |
| 2016/0033869 A1 | 2/2016 | Hustad et al. | |
| 2016/0195814 A1 | 7/2016 | Enomoto et al. | |

FOREIGN PATENT DOCUMENTS

| | | |
|---|---|---|
| WO | 2014127430 A1 | 8/2014 |
| WO | 2014163332 A1 | 10/2014 |

OTHER PUBLICATIONS

Namie, et al, "Polymer blends for directed self-assembly," Proc. of SPIE, vol. 8680, 2013, pp. 86801M-1-86801M-5.
Ya-Min Chuang, et al, "Using directed self-assembly of block copolymer nanostructures to modulate nanoscale surface roughness: Towards a novel lithographic process", Advanced Functional Materials, 2013, pp. 173-831, vol. 23.
Ya-Min Chuang, et al, "Healing LER using directed self-assembly: treatment of EUVL resists with aqueous solutions of block copolymers", Proc. of SPIE, 2013, pp. 868009-1 to 868009-10, vol. 8680.
Oyama, et al, "The enhanced photoresist shrink process technique toward 22nm node", Proc. of SPIE, Advances in Resist Materials and Processing Technology XXVIII, 2011, pp. 79722Q, vol. 7972.
Co-pending U.S. Appl. No. 15/172,228, filed Jun. 3, 2016.
Co-pending U.S. Appl. No. 15/172,246, filed Jun. 3, 2016.
Co-pending U.S. Appl. No. 15/172,276, filed Jun. 3, 2016.
Laura Peters, "Resists Join the Sub-Lambda Revolution", Semiconductor International, Sep. 1999, pp. 70-78.
Search report for corresponding Taiwan Application No. 105116936 dated Dec. 23, 2016.

* cited by examiner

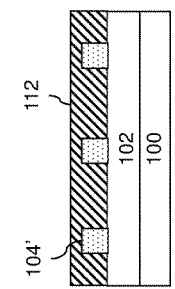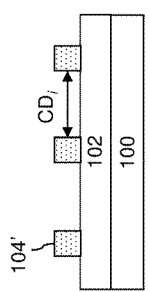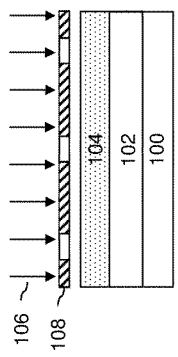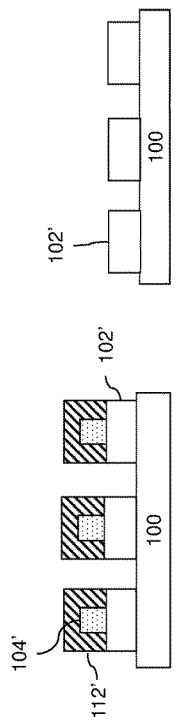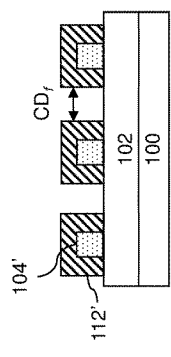

COMPOSITIONS AND METHODS FOR PATTERN TREATMENT

CROSS-REFERENCE TO RELATED APPLICATIONS

This application claims the benefit of priority under 35 U.S.C. §119(e) to U.S. Provisional Application No. 62/170,534, filed Jun. 3, 2015, the entire contents of which are incorporated herein by reference.

FIELD OF THE INVENTION

The invention relates generally to the manufacture of electronic devices. More specifically, this invention relates to compositions for treating patterns and to pattern treatment methods using the compositions. The compositions and methods find particular use in the manufacture of semiconductor devices in negative tone development shrink processes for the formation of fine patterns.

BACKGROUND OF THE INVENTION

In the semiconductor manufacturing industry, photoresist materials are used for transferring an image to one or more underlying layer, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing using a positive tone development (PTD) process. In the PTD process, exposed regions of a photoresist layer are soluble in a developer solution, typically an aqueous alkaline developer, and are removed from the substrate surface, whereas unexposed regions which are insoluble in the developer remain after development to form a positive image. To improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer.

Considerable effort has been made to extend the practical resolution beyond that achieved with positive tone development from both a materials and processing standpoint. One such example is the negative tone development (NTD) process. The NTD process allows for improved resolution and process window as compared with standard positive tone imaging by making use of the superior imaging quality obtained with bright field masks for printing critical dark field layers. NTD resists typically employ a resin having acid-labile (also referred to herein as acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by organic solvent developers, leaving behind a pattern created by the insoluble exposed regions.

To further extend resolution capabilities beyond those typically obtained with standard resist patterning techniques, various processes for pattern shrink have been proposed. These processes involve increasing the effective thickness of the resist pattern sidewalls to reduce (i.e., "shrink") the spacing, for example, between adjacent lines or within a trench or hole pattern. In this way, features such as trenches and contact holes formed from the patterns can be made smaller. Known shrink techniques include, for example, chemical vapor deposition (CVD) assist, acid diffusion resist growth, thermal flow and polymer blend self-assembly.

The CVD assist shrink process (see K. Oyama et al, "The enhanced photoresist shrink process technique toward 22 nm node", *Proc. SPIE* 7972, Advances in Resist Materials and Processing Technology XXVIII, 79722Q (2011)), uses a CVD-deposited layer formed over a photoresist pattern including, for example, contact hole, line/space or trench patterns. The CVD material is etched back, leaving the material on sidewalls of the resist pattern. This increases the effective lateral dimensions of the resist pattern, thereby reducing the open areas that expose the underlying layer to be etched. The CVD assist shrink technique requires use of CVD and etching tools which are costly, add to the complexity of the process and are disadvantageous in terms of process throughput.

In the acid diffusion resist growth process, also referred to as the RELACS process (see L. Peters, "Resists Join the Sub-λ Revolution", Semiconductor International, 1999. 9), an acid-catalyzed crosslinkable material is coated over a PTD-generated resist patterned surface. Crosslinking of the material is catalyzed by an acid component present in the resist pattern that diffuses into the crosslinkable material during a baking step. The crosslinking takes place in the material in the vicinity of the resist pattern in the acid diffusion region to form a coating on sidewalls of the pattern, thereby reducing the lateral dimension of open areas of the pattern. This process typically suffers from iso-dense bias (IDB), wherein growth of the crosslinked layer on the resist pattern occurs non-uniformly across the die surface depending on density (spacing between) adjacent resist patterns. As a result, the extent of "shrink" for identical features can vary across die based on pattern density. This can lead to patterning defects and variations in electrical characteristics across the die for what are intended to be identical devices.

Polymer blend self-assembly (see Y. Namie et al, "Polymer blends for directed self-assembly", *Proc. SPIE* 8680, Alternative Lithographic Technologies V, 86801M (2013)) involves coating a composition containing an immiscible blend of hydrophilic and hydrophobic polymers over the photoresist pattern. The composition is then annealed, causing the polymers to phase separate, wherein the hydrophilic polymer preferentially segregates to the resist pattern sidewalls and the hydrophobic polymer fills the remainder of the volume between the resist pattern sidewalls. The hydrophobic polymer is next removed by solvent development, leaving the hydrophilic polymer on the resist pattern sidewalls. Polymer blend self-assembly has been found to suffer from proximity and size effects. As the shrink ratio is determined by the volume ratio of the two polymers, all features shrink by the same relative percentage rather than by the same absolute amount. This can lead to the same problems described with respect to the acid diffusion resist growth technique.

There is a continuing need in the art for improved pattern treatment compositions and pattern treatment methods which address one or more problems associated with the state of the art and which allow for the formation of fine patterns in electronic device fabrication.

SUMMARY

In accordance with a first aspect of the invention, pattern treatment compositions are provided. The compositions comprise a block copolymer and an organic solvent. The block copolymer comprises a first block and a second block, wherein the first block comprises a unit formed from a first monomer comprising an ethylenically unsaturated polymerizable group and a hydrogen acceptor group, wherein the hydrogen acceptor group is a nitrogen-containing group. The second block comprises a unit formed from a second monomer comprising an ethylenically unsaturated polymerizable group and a cyclic aliphatic group, and wherein: (i) the second block comprises a unit formed from a third monomer comprising an ethylenically unsaturated polymerizable group, and the second monomer and the third monomer are different; and/or (ii) the block copolymer comprises a third block comprising a unit formed from a fourth monomer comprising an ethylenically unsaturated polymerizable group, wherein the fourth monomer is different from the first monomer and the second monomer.

In accordance with a further aspect of the invention, pattern treatment methods are provided. The methods comprise: (a) providing a semiconductor substrate comprising a patterned feature on a surface thereof; (b) applying a pattern treatment composition as described herein to the patterned feature; and (c) rinsing residual pattern treatment composition from the substrate, leaving a portion of the first polymer bonded to the patterned feature.

Also provided are coated substrates and electronic devices formed by the methods described herein. The invention finds particular applicability in the manufacture of semiconductor devices for providing high resolution patterns.

The terminology used herein is for the purpose of describing particular embodiments only and is not intended to be limiting of the invention. As used herein, the singular forms "a", "an" and "the" are intended to include both singular and plural forms, unless the context clearly indicates otherwise. The initials "b" and "r" as used in polymer structures refer to block and random polymers, respectively.

BRIEF DESCRIPTION OF THE DRAWINGS

The present invention will be described with reference to the following drawings, in which like reference numerals denote like features, and in which:

FIG. 1A-F is a process flow for a pattern treatment process in accordance with the invention.

DETAILED DESCRIPTION

Pattern Treatment Compositions

Figure 2:
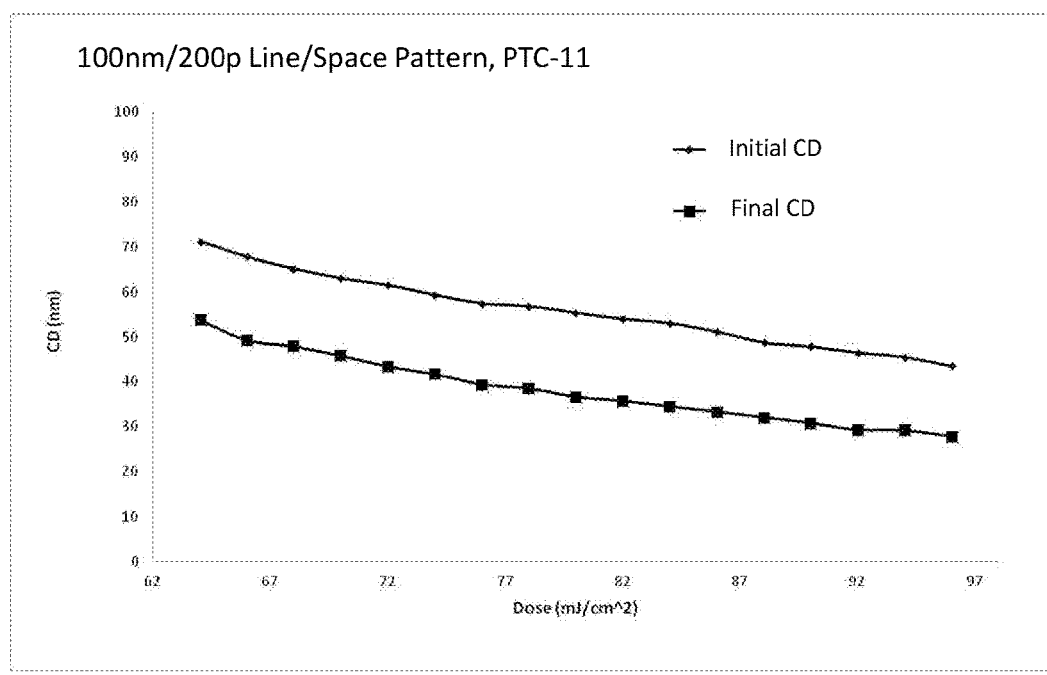
FIG. 2 is a plot of CD as a function of dose for photoresist line/space patterns before and after treatment with a pattern treatment composition in accordance with the invention.

The pattern treatment compositions of the invention include a block copolymer and an organic solvent. The block copolymer comprises a first block and a second block, wherein the first block comprises a unit formed from a first monomer comprising an ethylenically unsaturated polymerizable group and a hydrogen acceptor group which is a nitrogen-containing group. The second block comprises a unit formed from a second monomer comprising an ethylenically unsaturated polymerizable group and a cyclic aliphatic group. The second block comprises a unit formed from a third monomer comprising an ethylenically unsaturated polymerizable group, and the second monomer and the third monomer are different; and/or the block copolymer comprises a third block comprising a unit formed from a fourth monomer comprising an ethylenically unsaturated polymerizable group, wherein the fourth monomer is different from the first monomer and the second monomer.

The compositions, when coated over a pattern, for example, an NTD-formed photoresist pattern such as a contact hole, trench or line and space pattern, allow for a consistent shrink value regardless of feature size or density. That is, the compositions allow for a shrink pattern exhibiting minimal or no proximity bias. In addition, the pattern treatment compositions can be coated using a spin-coating tool, thereby allowing for simplified processing and ease in integration with the photoresist patterning process.

The block copolymer is typically made up of units formed from monomers having an ethylenically unsaturated polymerizable group. Preferred such monomers are those having a polymerizable group independently chosen from vinyl, for example, (C1 to C3 alkyl or haloalkyl)acrylates. Suitable haloalkylacrylates include, for example, fluoroalkyl, chloroalkyl, bromoalkyl and iodoalkylacrylates, with fluoroalkylacrylates being preferred. The block copolymer can optionally be free of haloalkyl groups, for example, free of fluoroalkyl, chloroalkyl, bromoalkyl and/or iodoalkyl groups.

Suitable block copolymers for the pattern treatment compositions can include two or more blocks, for example, two, three, four or more blocks. One or more block making up the copolymer can independently be chosen, for example, from linear blocks, branched blocks, star blocks, dendritic blocks, and combinations thereof. Typically, the block copolymer is a linear copolymer, wherein each block of the copolymer is linear. The blocks of the copolymer can be formed, for example, as a homopolymer or as a copolymer containing two or more different units, for example two, three, four or more different units.

The block copolymer is capable of adhering to an NTD-formed photoresist pattern, for example, by bonding with an acid and/or alcohol group present on the resist pattern surface as a result of deprotection during the resist patterning process. The block copolymer has a first block comprising an anchoring group for attaching the block copolymer to the deprotected group of the resist pattern. The anchoring component includes a unit comprising a nitrogen-containing hydrogen acceptor group. The block copolymer has a second block attached directly or indirectly to the first block for adding additional length to the block copolymer for effectively increasing the dimensions of the resist pattern. The second block includes a unit comprising a cyclic aliphatic moiety. The second block is preferably effective to provide a smooth surface having low linewidth roughness (LWR).

The anchoring group of the first block is pendant to the polymer backbone. The polymer backbone for the first block is typically made up of units formed from monomers having an ethylenically unsaturated polymerizable group, preferred of which are vinyl, for example, (C1 to C3 alkyl or haloalkyl)acrylates such as fluoroalkylacrylates, and vinyl pyridines. The group containing a hydrogen acceptor is effective to form a bond, preferably an ionic or hydrogen bond, with a deprotected acid group and/or alcohol group at a surface of the resist pattern. The group containing the hydrogen acceptor is a nitrogen-containing group. Suitable nitrogen-containing groups can form an ionic bond with an acid group at the surface of the resist pattern. Suitable nitrogen-containing groups include, for example, one or more group chosen from: amines, for example, primary amines such as N-methylamine, N-ethylamine, 1-aminopropane, 2-aminopropane and N-t-butylamine, secondary amines such as dimethylamine, methylethylamine and diethylamine, and tertiary amines such as trimethylamine; amides, for example, alkylamides such as N-methylamide, N-ethylamide, N-phenylamide and N,N-dimethylamide; imines, for example, primary and secondary aldimines and ketimines; diazines, for example optionally substituted pyrazine, piperazine, phenazine; diazoles, for example, optionally substituted pyrazole, thiadiazole and imidazole; optionally substituted pyridine, for example, pyridine, 2-vinylpyridine and 4-vinylpyridine; pyridinium; optionally substituted pyrrolidones, for example, 2-pyrrolidone, N-vinylpyrrolidone and cyclohexyl pyrrolidine; and combinations thereof. Of these, amines, amides and vinylpyridines are preferred. The nitrogen-containing group can optionally take the form of a ring pendant to the polymer backbone, for example, pyridine, indole, imidazole, triazine, pyrrolidine, azacyclopropane, azacyclobutane, piperidine, pyrrole, purine, diazetidine, dithiazine, azocane, azonane, quinoline, carbazole, acridine, indazole and benzimidazole. Preferably, the nitrogen-containing group has less than three, less than two or less than one (i.e., no) branched carbon at alpha positions with respect to the nitrogen atom for steric reasons. The first block is typically free of acid-labile groups.

Suitable monomer units for the first block include, for example, 2-(N,N-dimethylamino)ethyl methacrylate, 2-(N,N-diethylamino)ethyl methacrylate, 2-(tert-butylamino) ethyl methacrylate, 2-N-morpholinoethyl acrylate, 2-N-morpholinoethyl methacrylate, 3-dimethylaminoneopentyl acrylate, N-(t-BOC-aminopropyl) methacrylamide, N-[2-(N,N-dimethylamino)ethyl]methacrylamide, N-[3-(N,N-dimethylamino)propyl]acrylamide, N-[3-(N,N-dimethylamino)propyl]methacrylamide, 2-vinylpyridine, 4-vinylpyridine, N-(3-aminopropyl)methacrylamide, 2-aminoethyl methacrylate, 2-(dimethylamino)styrene, 4-N-tert-Butoxycarbonyl piperidine-1-methacrylate, 4-(dimethylamino)styrene, and N-vinylpyrrolidone.

The second block includes a unit comprising a cyclic aliphatic moiety. Suitable cyclic aliphatic moieties include monocyclic and polycyclic structures. The polycyclic structure can, for example, be of a fused-, bridge- or tethered-structure, and can be saturated or unsaturated. Suitable cyclic aliphatic moieties include, for example, optionally substituted C3 to C20 cyclic moieties, for example, moieties chosen from optionally substituted cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl, and tetracyclododecanyl. Of these, optionally substituted cyclohexyl, adamantyl and norbornyl groups are preferred.

Suitable monomers for use in forming the second block containing the cyclic aliphatic moiety include, for example, the following:

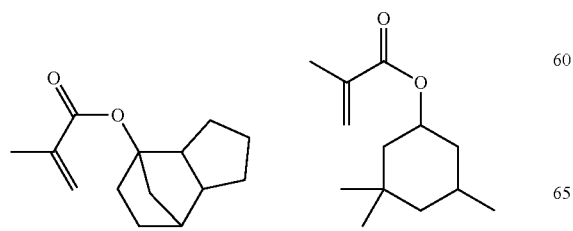

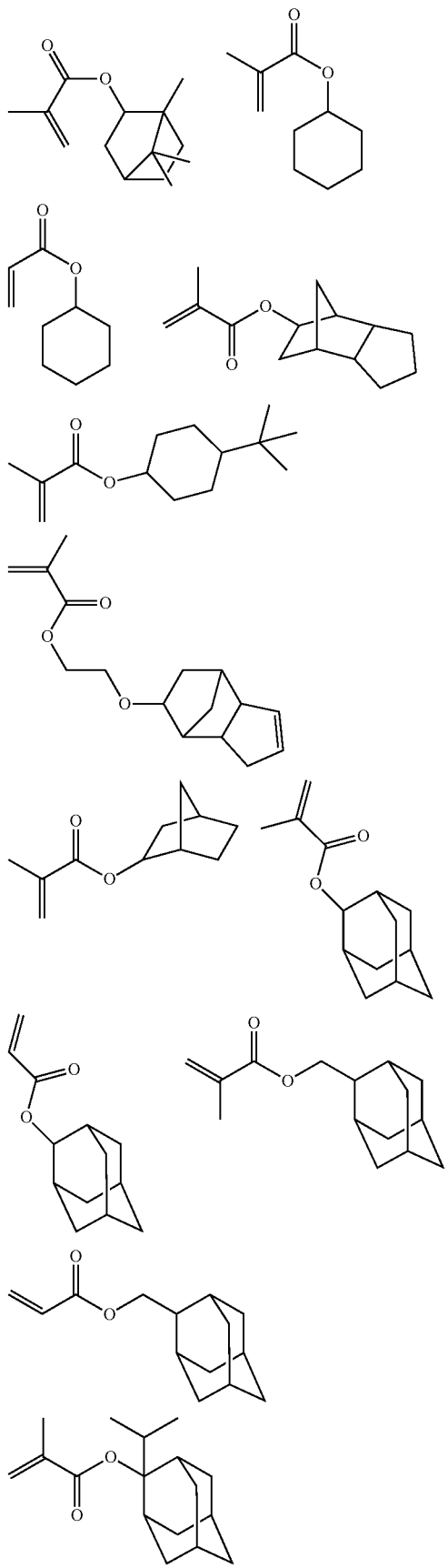

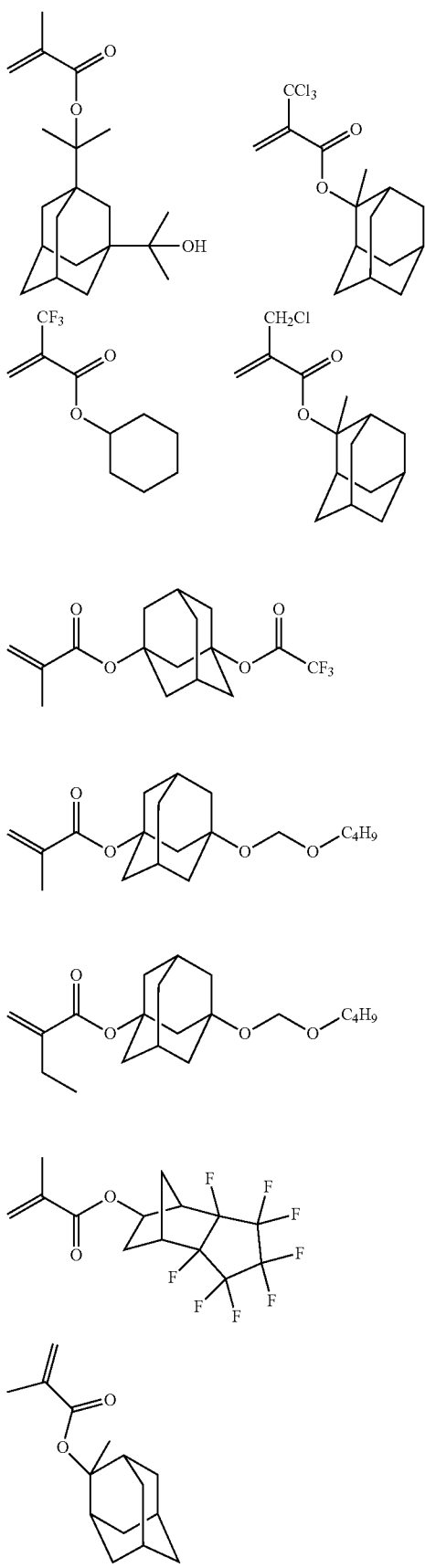
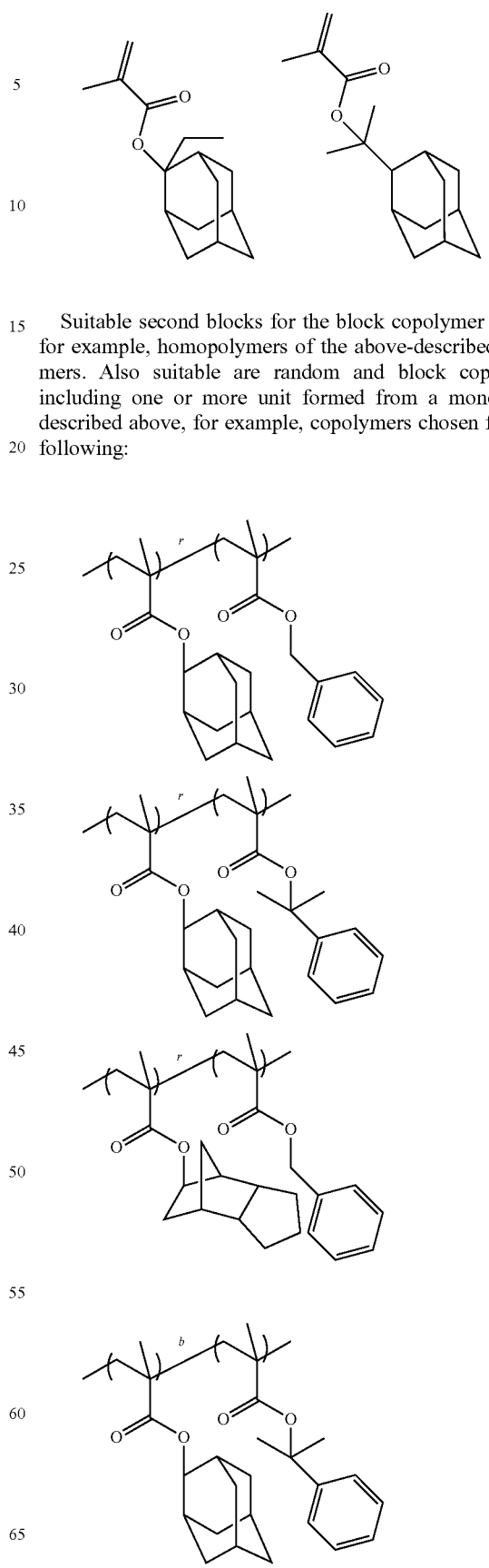
Suitable second blocks for the block copolymer include, for example, homopolymers of the above-described monomers. Also suitable are random and block copolymers including one or more unit formed from a monomer as described above, for example, copolymers chosen from the following:

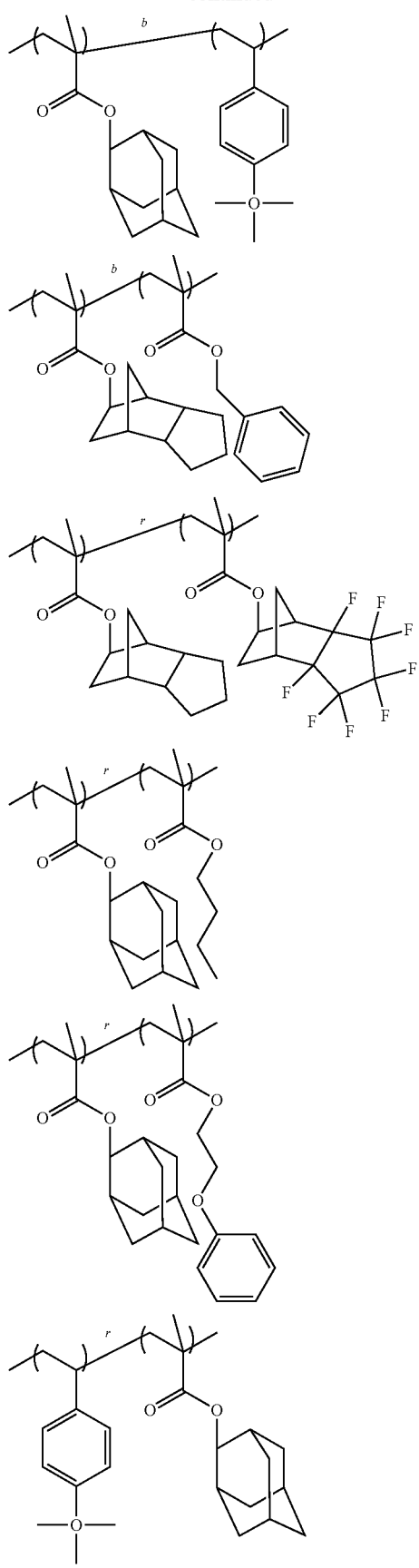
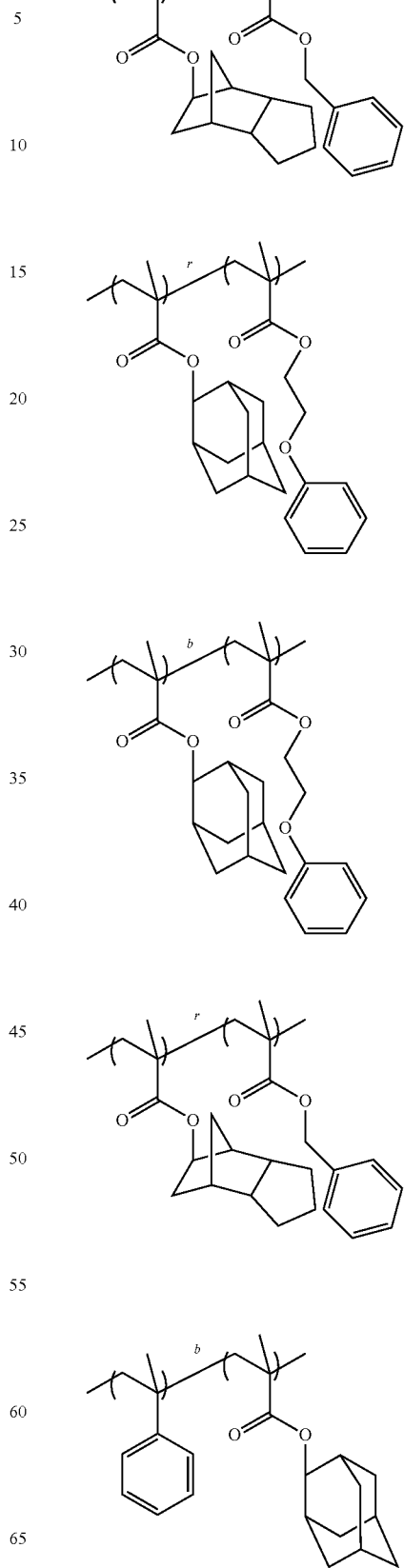

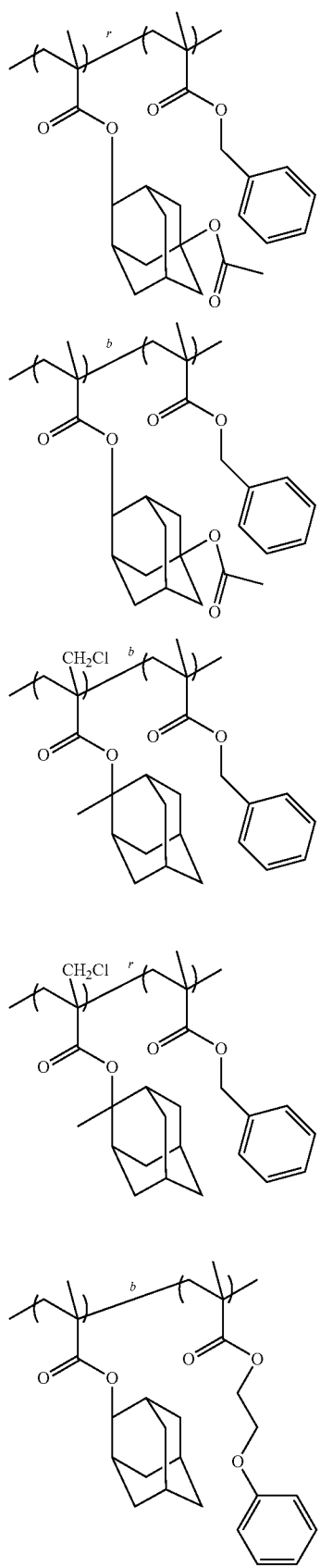
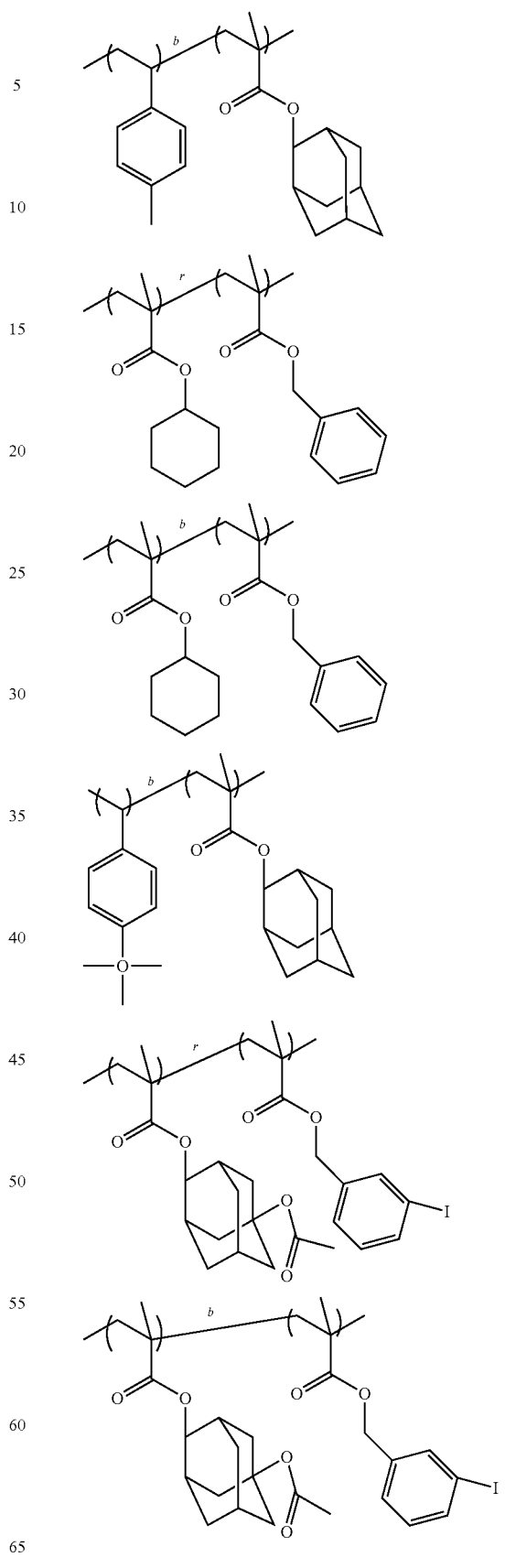

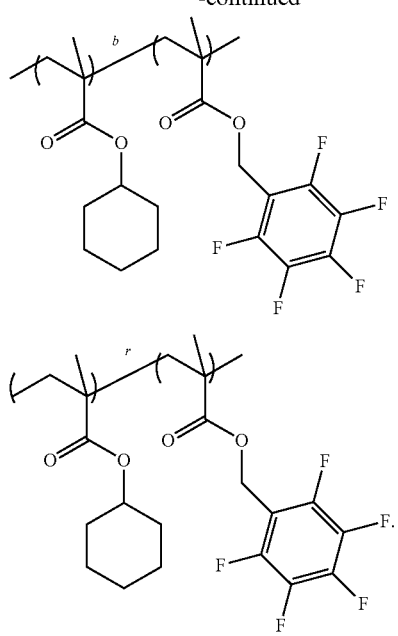

One or more additional blocks can optionally be included in the block copolymer. The additional blocks can include one or more additional blocks of the type described with respect to the first and second blocks, and/or can include other types of blocks. The use of additional blocks can be used, for example, to modify the characteristics of the block copolymer such as one or more of shrink (pattern growth) amount, etch resistance, solubility, Tg, and dissolution rate in developer. The additional block preferably is formed from a monomer having an ethylenically unsaturated polymerizable group such as a vinyl group as described above with respect to the first and second blocks. If present, an additional block is typically bonded to the second block.

In a preferred aspect, an additional block containing an aromatic moiety can be included in the block copolymer. Inclusion of an aromatic moiety can be beneficial, for example, to enhance etch resistance and/or solubility properties of the block copolymer. Suitable aromatic moiety-containing blocks include, for example, those formed from one or more of the following monomers having an ethylenically unsaturated double bond optionally with one or more additional monomers:

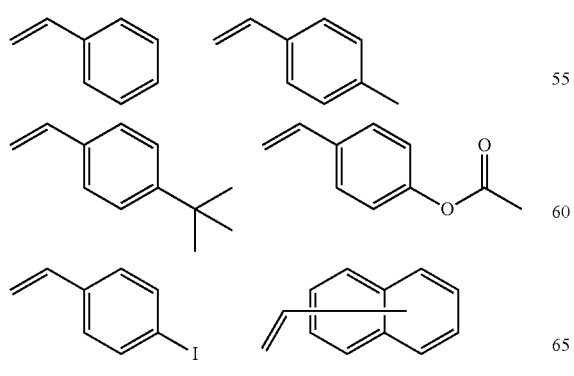

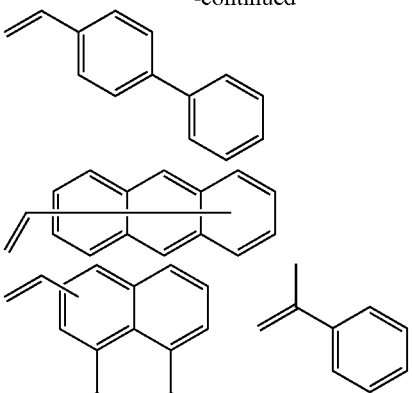

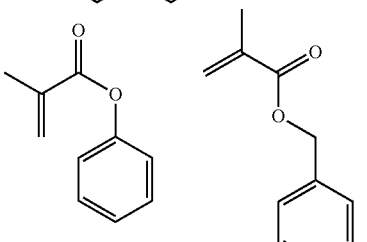

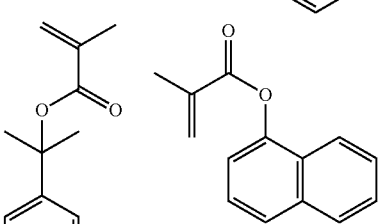

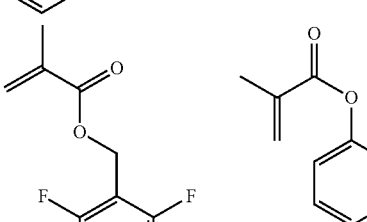

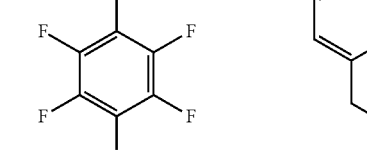

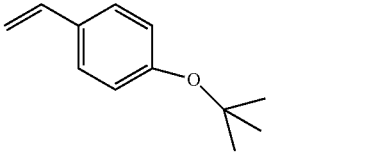

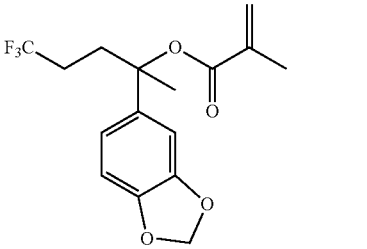

-continued

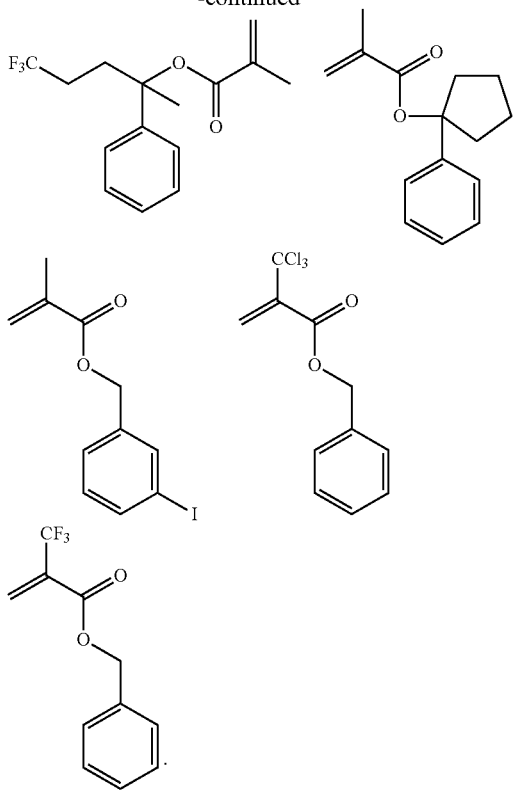

By selection of a suitable block copolymer, the amount of growth of the polymer on the resist pattern sidewall can be accurately controlled. This thickness can be controlled, for example, by selection of a suitable molecular weight for first, second and optional additional blocks, with higher molecular weights typically resulting in greater thicknesses and lower molecular weights typically resulting in lesser thicknesses. The chemical composition of the block copolymer can also influence the amount of growth. For example, polymers with a longer unperturbed end-to-end distance or characteristic ratio provide larger shrink for a given molecular weight.

The block copolymer should have good solubility in an organic solvent used in the composition and an organic solvent used to rinse and remove excess polymer (i.e., polymer not attached to the resist pattern) from the substrate. The content of the block copolymer in the resist treatment composition will depend, for example, on the desired coating thickness of the resist treatment composition. The block copolymer is typically present in the compositions in an amount of from 80 to 99 wt %, more typically from 90 to 99 wt %, based on total solids of the composition. The weight average molecular weight of the polymer is typically less than 400,000, preferably from 5000 to 200,000, more preferably from 1000 to 125,000 g/mol.

The polymer preferably has good etch resistance to facilitate pattern transfer. For carbon based polymers, the "Ohnishi parameter" can generally be used as an indicator of etch resistance of a polymer (J. Electrochem Soc, 143, 130 (1983), H. Gokan, S. Esho and Y. Ohnishi). The Ohnishi parameter is used in general to indicate the carbon density of a polymer and is specifically determined by the following equation:

$N/(NC-NO)$=Ohnishi parameter where N is the combined total number of carbon atoms, hydrogen atoms and oxygen atoms, NC is the number of carbon atoms, and NO is the number of oxygen atoms. The increase of the carbon density of a polymer per unit volume (i.e., the decrease of the Ohnishi parameter) improves the etching resistance thereof. The Ohnishi parameter for carbon-based polymers useful in the invention is typically less than 4.5, preferably less than 4, and more preferably less than 3.5.

Suitable block copolymers useful in the compositions of the invention include, for example, the following:

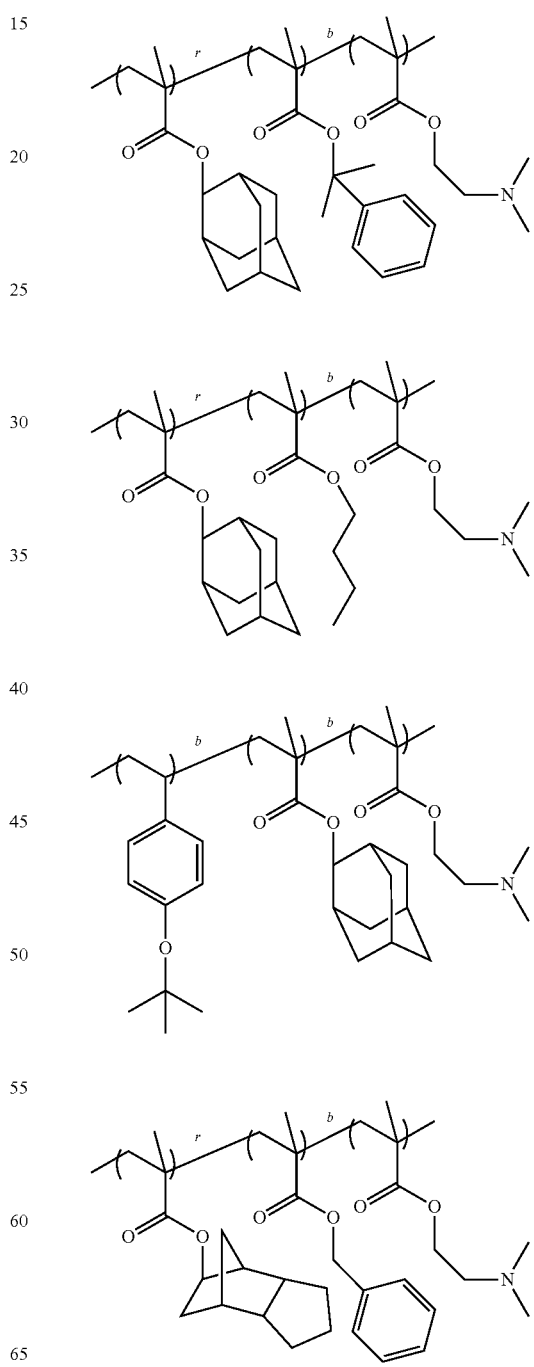

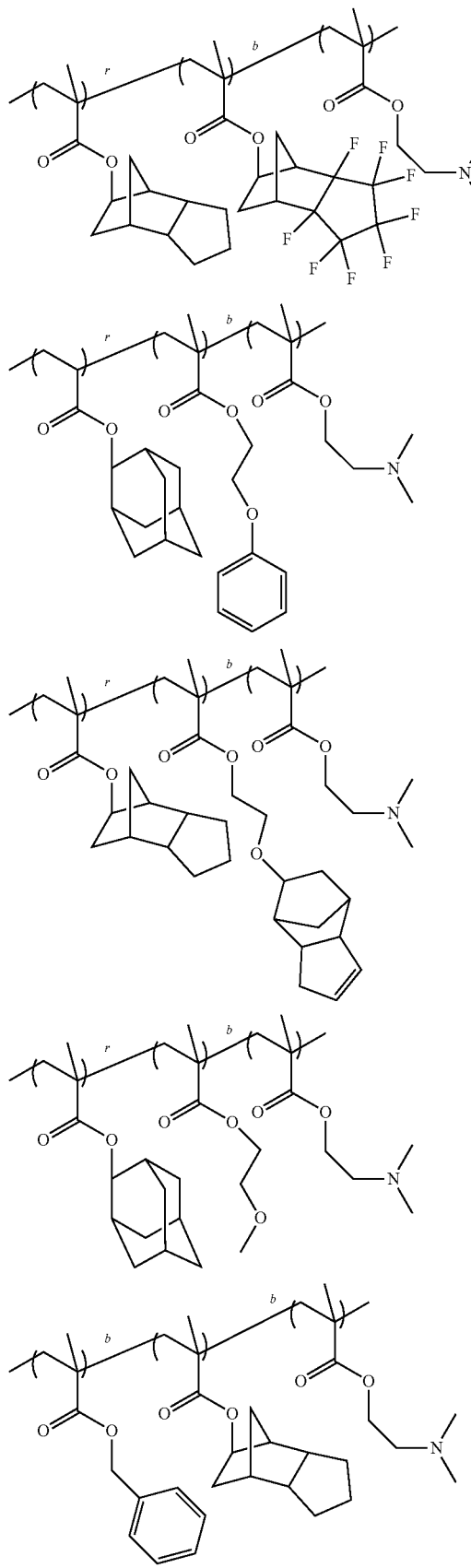
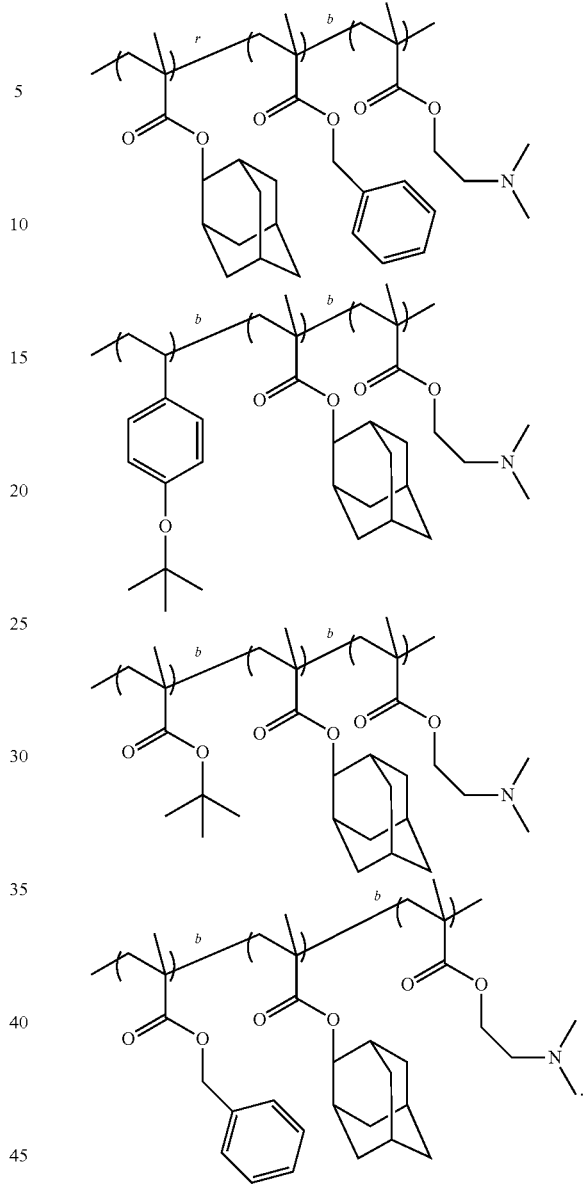

The pattern treatment compositions typically include a single block copolymer, but can optionally include one or more additional block copolymer as described above and/or other polymer. Suitable block copolymers for use in the pattern treatment compositions are commercially available and/or can readily be made by persons skilled in the art. The block copolymer can be subjected to purification prior to being combined with the other components of the pattern treatment composition for removal of metallic and/or non-metallic impurities. Purification can involve, for example, one or more of washing, slurrying, centrifugation, filtration, distillation, decantation, evaporation and treatment with ion exchange beads.

The pattern treatment compositions further include an organic solvent which can be in the form of a single organic solvent or a mixture of organic solvents. Suitable solvent materials to formulate and cast the pattern treatment compositions exhibit excellent solubility characteristics with respect to the non-solvent components of the compositions, but do not appreciably dissolve an underlying photoresist pattern. Suitable organic solvents for the pattern treatment compositions include, for example: alkyl esters such as n-butyl acetate, n-butyl propionate, n-pentyl propionate, n-hexyl propionate and n-heptyl propionate, and alkyl butyrates such as n-butyl butyrate, isobutyl butyrate and isobutyl isobutyrate; ketones such as 2-heptanone, 2,6-dimethyl-4-heptanone and 2,5-dimethyl-4-hexanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; toluene, anisole and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the composition is typically present in an amount of from 90 to 99 wt % based on the total composition.

The pattern treatment compositions can include one or more optional additives including, for example, surfactants and antioxidants. Such optional additives if used are each typically present in the composition in minor amounts such as from 0.01 to 10 wt % based on total solids of the composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

An antioxidant can be added to prevent or minimize oxidation of organic materials in the pattern treatment composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl-hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl-anilino)2,4-bis-octyl-thio-1, 3,5-triazine, n-octadecyl-3-(4'-hydroxy-3',5'-di-tert-butyl-phenyl)propionate, octylated phenol, aralkyl-substituted phenols, alkylated p-cresol and hindered phenol; bis-, tris- and poly-phenols such as 4,4'-dihydrox.diphenyl, methylene-bis(dimethyl-4,6-phenol), 2,2'-methylene-bis-(4-methyl-6-tert-butylphenol), 2,2'-methylene-bis-(4-methyl-6-cyclohexyl-phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl-diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The pattern treatment composition is preferably free of crosslinkers such as typically used in acid diffusion resist growth processes. These processes are known to suffer from proximity and size bias, where, for example, isolated holes shrink more than dense holes due to the concentration of acid in the remaining photoresist. In addition to being free of crosslinkers, the pattern treatment compositions are preferably free of acids, acid generator compounds, for example, thermal acid generator compounds and photoacid generator compounds, as such compounds may limit the amount of trench/hole shrink achievable by the composition by competing with the acid/alcohol of the resist with the anchoring functionality of the composition.

The pattern treatment compositions can be prepared following known procedures. For example, the compositions can be prepared by dissolving the block copolymer and other optional solid components of the composition in the solvent components. The desired total solids content of the compositions will depend on factors such as the particular polymer(s) in the composition and desired final layer thickness. Preferably, the solids content of the pattern treatment compositions is from 1 to 10 wt %, more preferably from 1 to 5 wt %, based on the total weight of the composition.

Photoresist Compositions

Photoresist compositions useful in the invention include chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group. Suitable photoresist compositions useful for the invention are commercially available.

For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene. Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris (trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis (2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis (azanetriyl))tetraethanol, and 2-(dibutylamino)ethanol, 2,2', 2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable photoresists are known in the art and include, for example, photoresists described in US Patent Publications US20130115559A1, US20110294069A1, US20120064456A1, US20120288794A1, US20120171617A1, US20120219902A1 and U.S. Pat. No. 7,998,655B2.

Pattern Treatment Methods

Processes in accordance with the invention will now be described with reference to FIG. 1A-F, which illustrates an exemplary process flow for forming a photolithographic pattern by negative tone development.

FIG. 1A depicts in cross-section a substrate 100 which can include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Dow Electronic Materials (Marlborough, Mass. USA), such as AR™ 40A and AR™ 124 antireflectant materials.

A photoresist layer 104 formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning A typical thickness for the photoresist layer 104 is from about 500 to 3000 Å.

The photoresist layer can next be soft baked to minimize the solvent content in the layer, thereby forming a tack-free coating and improving adhesion of the layer to the substrate. The soft bake can be conducted on a hotplate or in an oven, with a hotplate being typical. The soft bake temperature and time will depend, for example, on the particular material of the photoresist and thickness. Typical soft bakes are conducted at a temperature of from about 90 to 150° C., and a time of from about 30 to 90 seconds.

The photoresist layer 104 is next exposed to activating radiation through a patterned photomask 106 to create a difference in solubility between exposed and unexposed regions. References herein to exposing a photoresist composition to radiation that is activating for the composition indicate that the radiation is capable of forming a latent image in the photoresist composition. The photomask has optically transparent and optically opaque regions corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths (e.g., 13.5 nm) being typical. The methods find use in immersion or dry (non-immersion) lithography techniques. The exposure energy is typically from about 10 to 80 mJ/cm$^2$, dependent upon the exposure tool and the components of the photoresist composition.

Following exposure of the photoresist layer 104, a post-exposure bake (PEB) is performed. Acid generated by the acid generator causes cleavage of the acid cleavable leaving groups to form acid groups, typically carboxylic acid groups, and/or alcohol groups. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

The exposed photoresist layer is next developed to remove unexposed regions, leaving exposed regions forming a negative resist pattern 104' as shown in FIG. 1B. Resist pattern 104' includes the carboxylic acid group and/or the alcohol group. The negative tone developer is an organic solvent developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monomethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene, anisole and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

The organic solvent(s) are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature.

Following development, the resist pattern 104' can optionally be heat treated in a hardbake process to further remove solvent from the resist pattern. The optional hardbake is typically conducted with a hot plate or oven, and is typically conducted at a temperature of about 90° C. or higher, for example, from about 100 to 150° C., and a time of from about 30 to 120 seconds.

With reference to FIG. 1C, a pattern treatment composition as described herein is coated over the resist pattern 104' to form a pattern treatment composition layer 112. Depending on the particular process, the pattern treatment composition can be applied so as to cover the resist pattern entirely or to a height less than or equal to the thickness of the resist pattern so as not to cover the resist pattern top surface, depending on the particular application.

The pattern treatment composition layer 112 is typically next soft baked to remove solvent from the composition and to cause the polymer to diffuse and induce bonding between the anchoring portion of the polymer and the deprotected acid and/or alcohol group of the photoresist pattern. A typical soft bake for the pattern treatment composition is conducted at a temperature of from about 90 to 150° C., and a time of from about 30 to 120 seconds.

Residual pattern treatment composition including polymer that is not bonded to the resist pattern is next removed from the substrate by rinsing, leaving behind a layer 112' of the polymer bound to the resist pattern as shown in FIG. 1D. With removal of the residual pattern treatment composition, the effective thickness of the resist paten) sidewalls is increased, thereby reducing the spacing between adjacent lines or within a trench or hole pattern. Suitable rinsing solutions include organic solvent developers in which the polymer is soluble. Suitable materials include, for example, those developers described herein with respect to the NTD developers. Of these, n-butyl acetate and 2-heptanone are typical. The resulting image typically has an improved (i.e., reduced) surface roughness as compared with that of the resist pattern following development of the photoresist layer.

Optionally, a post-rinse bake can be conducted at a temperature above the $T_g$ of the block copolymer. This bake can provide beneficial results, for example, in the form of improved pattern roughness or circularity due to the thermodynamic drive of the polymer to minimize its interfacial area with air.

The one or more underlying layers 102 can next be selectively etched using the resist pattern 104' with bonded block copolymer 112' as an etch mask to expose the underlying substrate 100 as shown in FIG. 1E. Suitable etching techniques and chemistries for etching layers 102 are known in the art, with dry-etching processes such as reactive ion etching being typical. The resist pattern 104' and bonded block copolymer 112' are next removed from the substrate using known techniques, for example, an oxygen plasma ashing.

The following non-limiting examples are illustrative of the invention.

EXAMPLES

Number and weight-average molecular weights, Mn and Mw, and polydispersity (PDI) values (Mw/Mn) for the non-nitrogen-containing block polymers were measured by gel permeation chromatography (GPC) on a Waters alliance system equipped with a refractive index detector. Samples were dissolved in HPCL grade THF at a concentration of approximately 1 mg/mL and injected through four Shodex columns (KF805, KF804, KF803 and KF802). A flow rate of 1 mL/min and temperature of 35° C. were maintained. The columns were calibrated with narrow molecular weight PS standards (EasiCal PS-2, Polymer Laboratories, Inc.). For the nitrogen-containing block on the final block copolymers, the number average molecular weights Mn were calculated based on reactant feed charges and reported as "Mn Target".

Top-down scanning electron micrographs were acquired using a Hitachi S9380 SEM at 250K magnification. Cross-section SEM images were acquired after sectioning the wafer using an Amray 1910 scanning electron microscope. Critical dimension (CD) and pitch were determined based on the SEM images.

Photoresist Composition B Preparation 17.73 g Matrix Polymer A (15 wt % in PGMEA), 16.312 g PAG A solution (1 wt % in methyl-2-hydroxy isobutyrate), 3.463 g PAG B solution (1 wt % in PGMEA), 6.986 g PAG C solution (2 wt % in methyl-2-hydroxyisobutyrate), 4.185 g trioctylamine (1 wt % solution in PGMEA), 0.248 g Polymer Additive A (25 wt % solution in PGMEA), 25.63 g PGMEA, 9.69 g gamma-butyrolactone and 22.61 g methyl-2-hydroxyisobutyrate were mixed and filtered through a 0.2 µm Nylon filter.

Matrix Polymer A
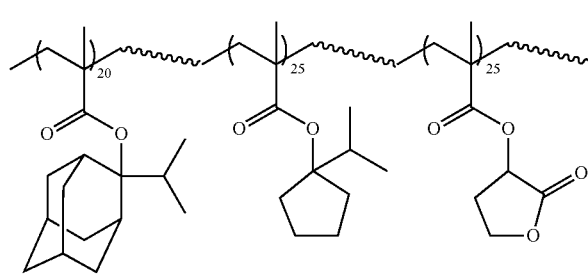
PAG A
PAG B
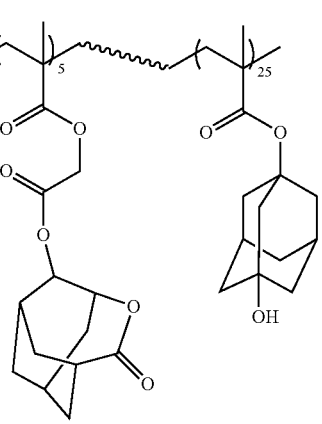
PAG C
Polymer Additive A
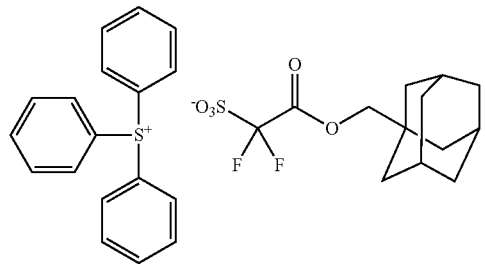
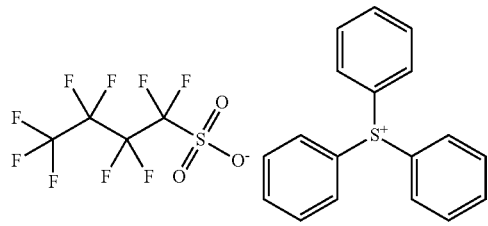
Pattern Treatment Composition Preparation
The following monomers were used to prepare pattern treatment composition Polymers P-1 to P-27 as described below.
-continued
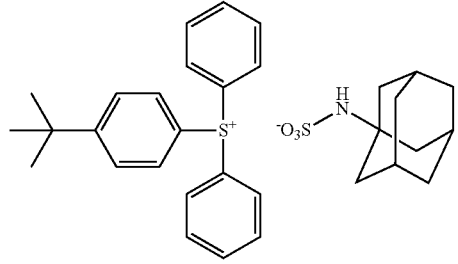
M1
M2
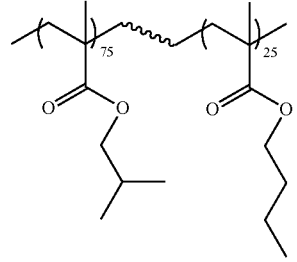
M3
M4
M5
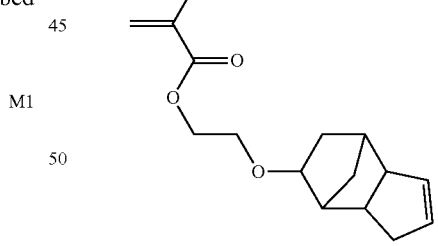
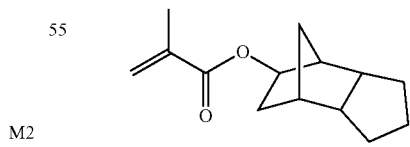
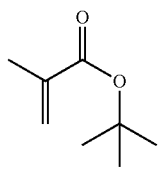

M6
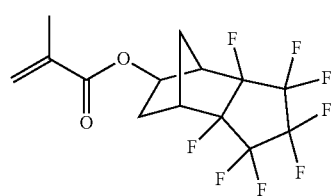
M7
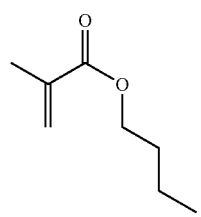
M8
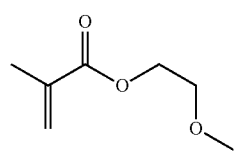
M9
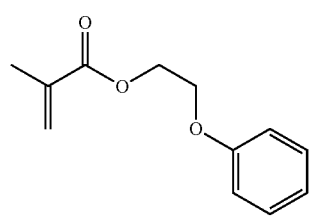
M10
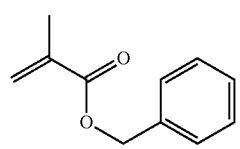
M11
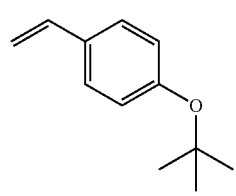
M12
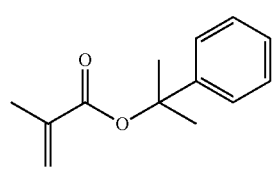
M13
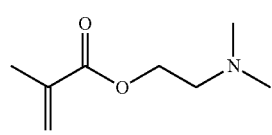
(P-1)
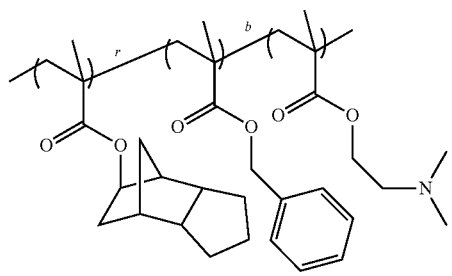
(P-2)
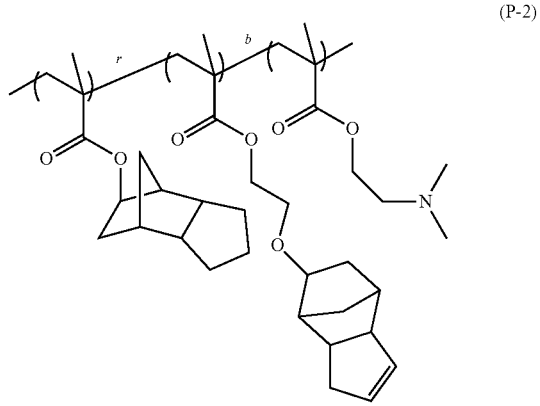
(P-3)
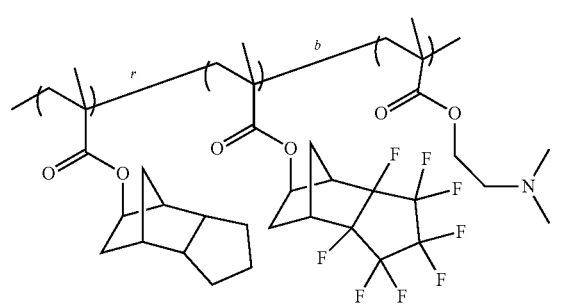
(P-4)
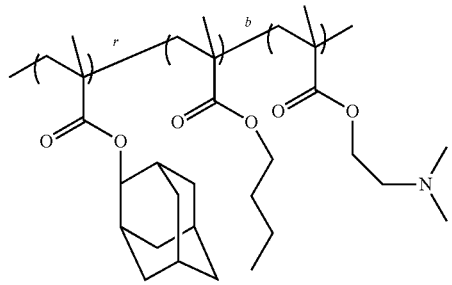
(P-5)
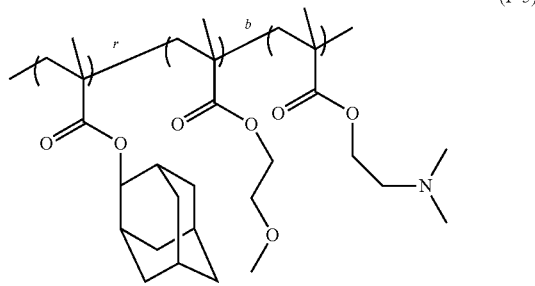

(P-6)
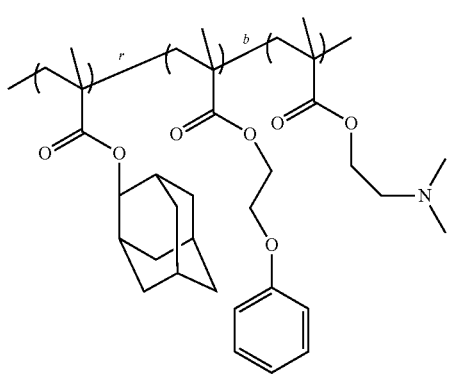

(P-7)
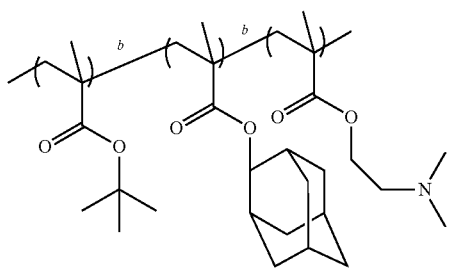

(P-8)
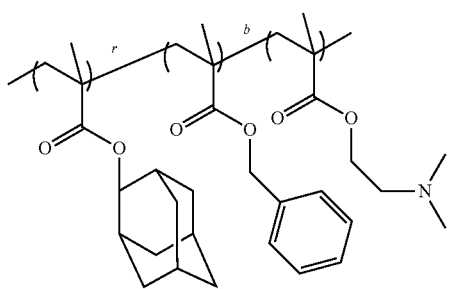

(P-9)
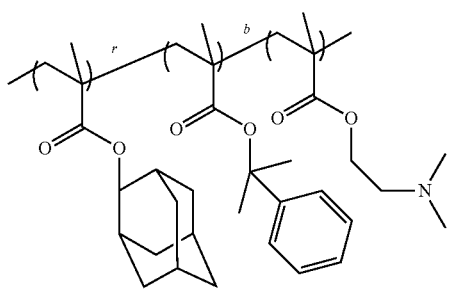

(P-10)
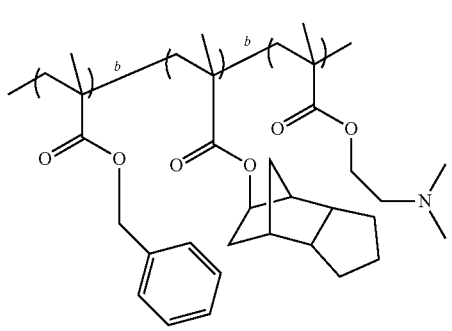

(P-11)
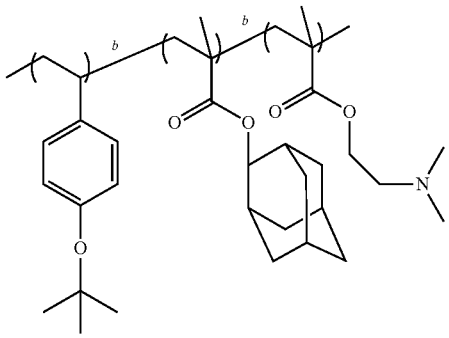

(P-12)
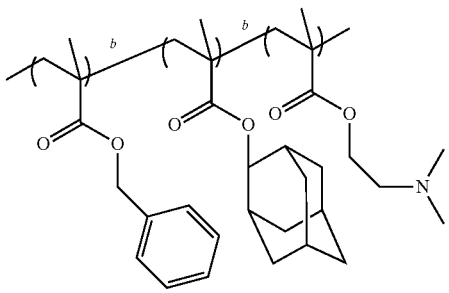

(P-13)
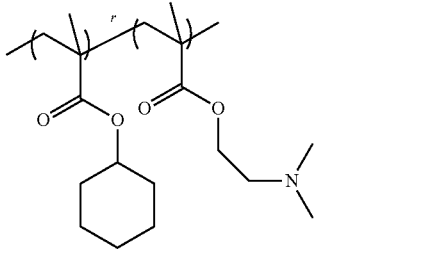

(P-14)
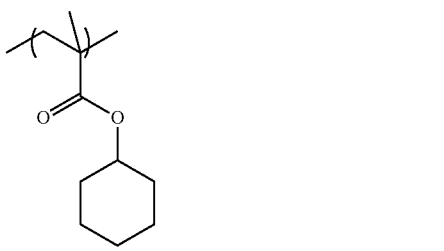

Reactant Polymer Synthesis

Example 1

0.019 g dimethyl 2,2'-azobis(2-methylpropionate) (DMAMP), 10 g monomer M4, 15 g monomer M10, 0.114 g 2-cyanopropan-2-yl benzodithioate (CPBD), 32 mL PGMEA and a magnetic stir bar were loaded into a 200 mL air-free flask. The mixture was freeze-pump-thawed three times with liquid nitrogen and the flask was then placed in a heat block at 70° C. for 16 hours. After the reaction, the flask was cooled. The reaction mixture was then precipitated into 500 mL of methanol. The precipitate was collected and re-precipitated. The polymer was collected and dried in a vacuum oven at 50° C. overnight. The resulting Polymer PP-1 had an Mn of 36 k (kg/mol) and a PDI of 1.15.

Examples 2-6

Polymers PP-2 to PP-6 were synthesized using a similar procedure as described above for Polymer PP-1, with the materials and amounts shown in Table 1. "Monomer A" and "Monomer B" were fed to the reactor at the same time.

TABLE 1

| Example | Polymer | Mn | PDI | CPBD | DMAMP | Solvent | Monomer A | Monomer B |
|---|---|---|---|---|---|---|---|---|
| 1 | PP-1 | 36k | 1.15 | 0.114 g | 0.019 g | PGMEA (32 mL) | M4 (10 g) | M10 (15 g) |
| 2 | PP-2 | 67k | 1.33 | 0.097 g | 0.016 g | PGMEA (23 mL) | M3 (6.4 g) | M4 (15 g) |
| 3 | PP-3 | 35k | 1.24 | 0.068 g | 0.012 g | PGMEA (13 mL) | M4 (10 g) | M6 (2.5 g) |
| 4 | PP-4 | 15.6k | 1.23 | 0.74 | 0.023 | PGMEA (17.4 mL) | M1 (5 g) | M7 (9.7 g) |
| 5 | PP-5 | 15.6k | 1.22 | 0.067 | 0.019 | PGMEA (22.7 mL) | M1 (10 g) | M8 (3.5 g) |
| 6 | PP-6 | 18k | 1.23 | 0.81 g | 0.023 g | PGMEA (18.5 mL) | M1 (10 g) | M9 (6.25 g) |

CPBD = 2-cyanopropan-2-yl benzodithioate; DMAMP = Dimethyl 2,2'-azobis(2-methylpropionate).

Block Copolymer Synthesis

Example 7

10 g Polymer PP-1, 2 g Monomer M13, 0.007 g dimethyl 2,2'-azobis(2-methylpropionate) (DMAMP), 25.44 mL dioxane and a magnetic stir bar were loaded into a 200 mL air-free reactor. The mixture was freeze-pump-thawed three times with liquid nitrogen. The reactor was then sealed with a septum and placed in a heat block at 70° C. for 16 hours. After the reaction, the flask was cooled. The reaction mixture was then precipitated into 500 mL methanol. The precipitate was collected and re-precipitated. The resulting Polymer P-1 was collected and dried in a vacuum oven at room temperature overnight.

Examples 8-13

Polymers P-2 to P-6 were synthesized using a similar procedure as described above for Polymer P-1, with the materials and amounts shown in Table 2.

TABLE 2

| Example | Block Copolymer | Mn Target | Polymer | Monomer | DMAMP | Dioxane |
|---|---|---|---|---|---|---|
| 8 | P-1 | 5k | PP-1 (10 g) | M13 (2 g) | 0.007 g | 25.44 mL |
| 9 | P-2 | 6k | PP-2 (10 g) | M13 (1.5 g) | 0.007 g | 19.08 mL |
| 10 | P-3 | 2.8k | PP-3 (1.5 g) | M13 (0.37 g) | 0.002 g | 4.77 mL |
| 11 | P-4 | 3k | PP-4 (8 g) | M13 (4 g) | 0.017 g | 50.0 mL |
| 12 | P-5 | 3.5k | PP-5 (7 g) | M13 (2.6 g) | 0.017 g | 33.0 mL |
| 13 | P-6 | 3.5k | PP-6 (7 g) | M13 (2.8 g) | 0.018 g | 35.21 mL |

DMAMP = Dimethyl 2,2'-azobis(2-methylpropionate); Mn Target = Mn for nitrogen-containing block calculated based on reactant feed charges.

Example 14

0.043 g dimethyl 2,2'-azobis(2-methylpropionate), 10.0 g Monomer M5 (t-butyl methacrylate), 0.341 g 2-cyanopropan-2-yl benzodithioate (CPBD), 17.5 g PGMEA and a magnetic stir bar were loaded into a 200 mL air-free flask. The mixture was freeze-pump-thawed three times with liquid nitrogen and the flask was then placed in a heat block at 70° C. for 16 hours. After the reaction, the flask was cooled and the reaction mixture was then precipitated into 500 mL methanol. The precipitate was collected and re-precipitated. The polymer was collected and dried in a vacuum oven at 50° C. overnight. The resulting polymer [Poly(t-butyl methacrylate)] had an Mn of 5.0 k and a PDI of 1.17.

2.0 g of the resulting polymer, 13.3 g Monomer M1 (adamantyl methacrylate), 0.014 g dimethyl 2,2'-azobis(2-methylpropionate), 15.5 g PGMEA and a magnetic stir bar were loaded into a 200 mL air-free reactor. The mixture was freeze-pump-thawed three times with liquid nitrogen and the flask was then placed in a heat block at 70° C. for 16 hours. After the reaction, the flask was cooled. The reaction mixture was then precipitated into 500 mL methanol, and the precipitate was collected and re-precipitated. The polymer was collected and dried in a vacuum oven at 50° C. overnight. The resulting polymer [Poly(t-butyl methacrylate)-b-Poly(adamantyl methacrylate)] had an Mn of 18 k and a PDI of 1.22.

7.0 g of the resulting polymer, 2.1 g Monomer M13 (dimethyl aminomethyl methacrylate), 0.008 g dimethyl 2,2'-azobis(2-methylpropionate), 26.72 g PGMEA and a magnetic stir bar were loaded into a 200 mL air-free reactor. The mixture was freeze-pump-thawed three times with liquid nitrogen and the flask was then placed in a heat block at 70° C. for 16 hours. After the reaction, the flask was cooled and the reaction mixture was precipitated into 500 mL methanol. The precipitate was collected and re-precipitated. The polymer was collected and dried in a vacuum oven at 50° C. overnight. The resulting Polymer P-7 had a target Mn of 5 k for the nitrogen-containing block.

Examples 15 and 16

Polymers P-8 and P-9 were synthesized using the materials and amounts set forth in Table 3. The monomers and solvents were freeze-pump-thawed three times to remove oxygen. The monomers were further purified prior to use with activated $Al_2O_3$ and were diluted with cyclohexane to about 50 vol % concentration. An amount of THF required for a reaction concentration of about 7-10 wt % solids was transferred to a reactor containing pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of diphenyl ethylene (DPE) and SBL initiator to yield a bright red color. First and second monomers ("Monomer A" and "Monomer B") were fed to the reactor and the contents were stirred for six hours. A reaction aliquot was collected by cannulating the polymer mixture in oxygen-free methanol. The precipitated polymer was analyzed by GPC for Mn. A third monomer ("Monomer C") was added to the reactor and the mixture was stirred for four hours at −78° C. The reaction aliquot was then quenched in oxygen-free methanol. The reaction product was precipitated out in methanol to yield a powdery white precipitate which was vacuum-dried in an oven at 50° C. for eight hours to yield a dry polymer as Polymers P-8 and P-9.

Examples 17-19

Polymers P-10 to P-12 were synthesized using the materials and amounts set forth in Table 3. The monomers and solvents were freeze-pump-thawed three times to remove oxygen. The monomers were further purified prior to use with activated $Al_2O_3$ and were diluted with cyclohexane to about 50 vol % concentration. An amount of THF required for a reaction concentration of about 7-10 wt % solids was transferred to a reactor containing pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of diphenyl ethylene (DPE) and SBL initiator to yield a bright red color. A first monomer ("Monomer A") was fed to the reactor and the contents were stirred for four hours. A reaction aliquot was collected by cannulating the polymer mixture in oxygen-free methanol. The precipitated polymer was analyzed by GPC for Mn. A second monomer ("Monomer B") was added to the reactor and the mixture was stirred for four hours at −78° C. The reaction aliquot was collected in oxygen-free methanol. The polymer was analyzed by GPC for Mn. A third monomer ("Monomer C") was added to the reactor and the mixture was stirred for four hours at −78° C. The reaction aliquot was then quenched in oxygen-free methanol. The reaction product was precipitated out in methanol to yield a powdery white precipitate which was vacuum-dried in an oven at 50° C. for eight hours to yield a dry polymer as Polymers P-10 to P-12.

TABLE 3

| Example | Block Copolymer | Mn | PDI | Mn Target | SBL | DPE | Monomer A | Monomer B | Monomer C |
|---------|----------------|-----|------|-----------|----------------|--------------|----------------|----------------|----------------|
| 15 | P-8  | 30k  | 1.04 | 3.5k | 2.42 mL (0.37M) | 0.33 g (73%)  | M1 (13.43 g)  | M10 (13.43 g) | M13 (2.42 g) |
| 16 | P-9  | 50k  | 1.05 | 3.5k | 1.01 ml (0.37M) | 0.14 g (73%)  | M1 (4.67 g)   | M12 (14.02 g) | M13 (1.32)   |
| 17 | P-10 | 60k* | 1.2  | 3.5k | 0.85 ml (0.37M) | 0.12 g (73%)  | M4 (15.75 g)  | M10 (3.15 g)  | M13 (1.1 g)  |
| 18 | P-11 | 67k* | 1.03 | 3.5k | 0.95 ml (0.45M) | 0.12 g (100%) | M1 (17.87 g)  | M11 (10.64 g) | M13 (1.49 g) |
| 19 | P-12 | 95k* | 1.09 | 3.5k | 0.68 ml (0.45M) | 0.08 g (100%) | M1 (18.27 g)  | M10 (10.66 g) | M13 (1.07 g) |

Mn = Mn for non-nitrogen-containing block; PDI = PDI for non-nitrogen-containing block; Mn Target = Mn for nitrogen-containing block calculated based on reactant feed charges; SBL = sec-butyl lithium; DPE = diphenyl ethylene;
*Mn for block formed from non-nitrogen containing blocks.

Example 20

Comparative 21 g PGMEA was charged to a 3-neck 100 ml round bottom flask and heated to 90° C. with a nitrogen purge. 17.1 g Monomer M2 and 0.9 g monomer M13 were pre-dissolved in 12.0 g PGMEA. 0.9 g V601 initiator (Wako Specialty Chemicals) was dissolved in 8.0 g PGMEA. Both monomer and initiator were fed into the reactor over a period of two hours. The contents were then held for two additional hours followed by cooling of the reaction mixture to ambient temperature. The polymer was precipitated out in methanol and dried for 8 hours in a vacuum oven at 50° C. to provide Polymer P-13 with a target Mw of 10 k.

Example 21

Comparative 500 g THF was cooled to −78° C. in a dry ice/isopropanol bath. The THF was titrated with sec-butyl lithium (SBL) in 0.7M cyclohexane. The reaction batch was warmed to room temperature until its greenish color fully disappeared. The reaction bath was again cooled to −78° C. followed by addition of 0.17 g diphenyl ethylene (100%) and 1.39 g SBL (0.45M in cyclohexane) initiator to yield a bright red color. 50.0 g Monomer M2 was fed to the reactor and the contents were stirred for an additional four hours. The reaction was then quenched by oxygen-free methanol. The contents were precipitated out in methanol to yield a powdery white precipitate. The precipitate was vacuum dried in an oven at 50° C. for 8 hours to provide Polymer P-14 with an Mn of 60 k.

Pattern Treatment Composition Preparation:

Pattern treatment compositions were prepared by dissolving the polymers set forth in Table 4 in 2-heptanone in amount to form 3 wt % solutions. The compositions were filtered with a 0.2 micron ultra-high molecular weight polyethylene (UPE) filter.

TABLE 4

| Example | Pattern Treatment Composition | Polymer No. | Polymer |
|---|---|---|---|
| 22 | PTC-1 | P-1 | P(M5-r-M13)-b-P(M17) |
| 23 | PTC-2 | P-2 | P(M5-r-M4)-b-P(M17) |
| 24 | PTC-3 | P-3 | P(M5-r-M8)-b-P(M17) |
| 25 | PTC-4 | P-4 | P(M1-r-M10)-b-P(M17) |
| 26 | PTC-5 | P-5 | P(M1-r-M11)-b-P(M17) |
| 27 | PTC-6 | P-6 | P(M1-r-M12)-b-P(M17) |
| 28 | PTC-7 | P-7 | P(M6)-b-P(M1)-b-P(M17) |
| 29 | PTC-8 | P-8 | P(M1-r-M13)-b-P(M17) |
| 30 | PTC-9 | P-9 | P(M1-r-M16)-b-P(M17) |
| 31 | PTC-10 | P-10 | P(M5)-b-P(M13)-b-P(M17) |
| 32 | PTC-11 | P-11 | P(M14)-b-P(M1)-b-P(M17) |
| 33 | PTC-12 | P-12 | P(M13)-b-P(M1)-P(M17) |
| 34 (Comp.) | PTC-13 | P-13 | P[(M2)-r-(M17)] |
| 35 (Comp.) | PTC-14 | P-14 | P(M2) |

Lithographic Processing

Examples 36-41

Shrink of Trench Patterns

Silicon wafers having line/space patterns were prepared and processed as follows. Eight-inch silicon wafers having a bilayer stack of 220 Å silicon-containing antireflective coating (SiARC) layer over 1350 Å organic underlayer were provided. A photoresist composition designated in Table 5 was coated over the bilayer stack and soft baked at 90° C. for 60 seconds on a TEL CLEAN TRACK™ LITHIUS™ i+ coater/developer, to a target resist thickness of 1000 Å. The photoresist layer was exposed using an ASML 1100 scanner with a numerical aperture (NA) of 0.75 and Dipole-35Y illumination through a reticle including line/space patterns with a pitch of 150 nm at various doses across each wafer. A post-exposure bake was performed at 90° C. for 60 seconds, and the photoresist layer was developed using an n-butylacetate (nBA) developer to form line/space patterns with a pitch of 150 nm and various critical dimensions (CDs) across the wafers. One of the resist-patterned wafers was observed by SEM as a control without further processing, and the average spacing between lines ($CD_i$) was measured. Other wafers were overcoated with a respective pattern treatment composition designated in Table 5 by spin coating at 1500 rpm on a TEL CLEAN TRACK™ LITHIUS™ i+ coater/developer. The patterned wafers were soft baked at 100° C. for 60 seconds, and rinsed with n-butylacetate on a spin-coater. The resulting patterns were observed by SEM and the average spacing between lines ($CD_f$) was measured at mid-height of the pattern. The average shrink amount $\Delta CD$ ($=CD_i-CD_f$) for the pattern treatment compositions was calculated. The results are shown in Table 5. FIG. 2 provides a representative plot of CD versus exposure dose before and after pattern treatment for pattern treatment composition PTC-11. The shrink amounts (ACD) at each dose over the measured ranges were substantially constant, indicating low proximity bias for pattern treatment compositions of the invention.

TABLE 5

| Example | Photoresist Composition | Pattern Treatment Composition | Polymer | Shrink Amt. (nm) |
|---|---|---|---|---|
| 36 | B | PTC-4 | P-4 | 8.2 |
| 37 | B | PTC-5 | P-5 | 11.9 |
| 38 | B | PTC-6 | P-6 | 12.6 |
| 39 | B | PTC-7 | P-7 | 15.5 |
| 40 | B | PTC-11 | P-11 | 18 |
| 41 | B | PTC-12 | P-12 | 22 |

Examples 42-49

Shrink of Contact Hole Patterns

Silicon wafers having contact hole patterns were prepared and processed as follows. Eight-inch silicon wafers having a bilayer stack of 220 Å silicon-containing antireflective coating (SiARC) layer over 1350 Å organic underlayer were provided. A photoresist composition designated in Table 6 was coated over the bilayer stack and soft baked at 90° C. for 60 seconds on a TEL CLEAN TRACK™ LITHIUS™ i+ coater/developer, to a target resist thickness of 1000 Å. The photoresist layer was exposed using an ASML 1100 scanner with a numerical aperture (NA) of 0.75 and Quadrapole 30 illumination through a reticle including contact hole patterns with a pitch of 300 nm at various doses across each wafer. A post-exposure bake was performed at 90° C. for 60 seconds, and the photoresist layer was developed using an n-butylacetate (nBA) developer to form contact hole patterns with a pitch of 300 nm and various critical dimensions (CDs) across the wafers. One of the resist-patterned wafers was observed by SEM as a control without further processing, and the average contact hole diameter ($CD_i$) was measured at mid-height of the pattern. Other wafers were overcoated with a respective pattern treatment composition designated in Table 6 by spin coating at 1500 rpm on a TEL CLEAN TRACK™ LITHIUS™ i+ coater/developer. The patterned wafers were soft baked at 100° C. for 60 seconds, and rinsed with n-butylacetate on a spin-coater. The resulting patterns were observed by SEM and the average contact hole diameter ($CD_f$) was measured at mid-height of the pattern. The average shrink amount $\Delta CD$ ($=CD_i-CD_f$) for the pattern treatment compositions was calculated. The results are shown in Table 6. The shrink amounts ($\Delta CD$) at each dose over the measured ranges were substantially constant, indicating low proximity bias for pattern treatment compositions of the invention.

TABLE 6

| Example | Photoresist Composition | Pattern Treatment Composition | Polymer | Shrink Amt. (nm) |
|---|---|---|---|---|
| 42 | C | PTC-1 | P-1 | 14.9 |
| 43 | C | PTC-2 | P-2 | 21.1 |
| 44 | C | PTC-3 | P-3 | 15.5 |
| 45 | C | PTC-8 | P-8 | 14.6 |
| 46 | B | PTC-9 | P-9 | 15.4 |
| 47 | B | PTC-10 | P-10 | 20.0 |
| 48 (Comp.) | B | PTC-13 | P-13 | 3.7 |
| 49 (Comp.) | B | PTC-14 | P-14 | 0 |

Photoresist Composition C = Epic ™ 2385 (Dow Electronic Materials).

What is claimed is:

1. A pattern treatment method, comprising:
   (a) providing a semiconductor substrate comprising a patterned feature on a surface thereof;

(b) applying a pattern treatment composition to the patterned feature, wherein the pattern treatment composition comprises a block copolymer and an organic solvent, wherein the block copolymer comprises a first block and a second block, wherein the first block comprises a unit formed from a first monomer comprising an ethylenically unsaturated polymerizable group and a hydrogen acceptor group, wherein the hydrogen acceptor group is a nitrogen-containing group, and the second block comprises a unit formed from a second monomer comprising an ethylenically unsaturated polymerizable group and a cyclic aliphatic group, and wherein: (i) the second block comprises a unit formed from a third monomer comprising an ethylenically unsaturated polymerizable group, and the second monomer and the third monomer are different and/or (ii) the block copolymer comprises a third block comprising a unit formed from a fourth monomer comprising an ethylenically unsaturated polymerizable group, wherein the fourth monomer is different from the first monomer and the second monomer;

(c) rinsing residual pattern treatment composition from the substrate, leaving a portion of the block copolymer bonded to the patterned feature; and (d) etching a layer underlying the patterned feature using the patterned feature and the bonded block copolymer as an etch mask.

2. The pattern treatment method of claim 1, wherein the nitrogen-containing group is chosen from amines, amides and pyridines.

3. The pattern treatment method of claim 2, wherein the first monomer is N,N-dimethylaminoethyl methacrylate or a vinyl pyridine.

4. The pattern treatment method of claim 1, wherein the cyclic aliphatic group is monocyclic.

5. The pattern treatment method of claim 1, wherein the cyclic aliphatic group is polycyclic.

6. The pattern treatment method of claim 1, wherein the cyclic aliphatic group is chosen from one or more of optionally substituted cyclohexyl groups, optionally substituted adamantyl groups and optionally substituted norbornyl groups.

7. The pattern treatment method of claim 1, wherein the second block comprises the unit formed from a third monomer, wherein the third monomer comprises an aliphatic group and/or an aromatic group.

8. The pattern treatment method of claim 1, wherein the composition comprises the third block comprising a unit formed from a fourth monomer, wherein the fourth monomer comprises an aliphatic group and/or an aromatic group.

9. The pattern treatment method of claim 1, wherein the first block is free of acid-labile groups.

10. The pattern treatment method of claim 1, wherein the block copolymer is free of fluoroalkyl groups.

11. The pattern treatment method of claim 1, wherein the patterned feature is a photoresist pattern.

* * * * *